(12) United States Patent
Gomez

(10) Patent No.: US 8,358,502 B2
(45) Date of Patent: Jan. 22, 2013

(54) RACK KIT

(75) Inventor: Adolfo Adolfo Gomez, Golden, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 336 days.

(21) Appl. No.: 12/917,974

(22) Filed: Nov. 2, 2010

(65) Prior Publication Data

US 2012/0106079 A1  May 3, 2012

(51) Int. Cl.
*G06F 1/16* (2006.01)

(52) U.S. Cl. ............... 361/679.58; 248/183.3; 312/265; 360/96.61

(58) Field of Classification Search ............ 211/26, 211/183; 248/222.13, 183.3, 685, 176.3; 312/223.1, 223.2, 208.4, 216, 244, 309, 326; 361/679.31, 679.34, 679.27, 679.09, 679.39, 361/679.35, 679.26, 679.55, 679.04, 679.56, 361/679.58, 679.02, 679.21; 360/90, 92.1, 360/93, 96.4, 96.61
See application file for complete search history.

(56) References Cited

U.S. PATENT DOCUMENTS

| | | | |
|---|---|---|---|
| 6,201,702 B1 * | 3/2001 | Schmitt | 361/725 |
| 6,442,030 B1 * | 8/2002 | Mammoser et al. | 361/727 |
| 6,554,142 B2 | 4/2003 | Gray | |
| 6,588,866 B2 | 7/2003 | Cheng | |
| 6,935,521 B2 | 8/2005 | Gundlach et al. | |
| 6,948,691 B2 | 9/2005 | Brock et al. | |
| 2010/0089853 A1 | 4/2010 | Wang et al. | |
| 2012/0112611 A1 * | 5/2012 | Chen et al. | 312/223.2 |

* cited by examiner

Primary Examiner — Hung Duong

(57) ABSTRACT

A rack kit and associated system and method for placing an electronic device into a rack. The rack kit includes depth-adjustable fixed rails to attach to the rack and a tray to receive the electronic device, wherein the tray is slidably fitted with the rails and has a latch to engage the rails. The rack kit includes an interchangeable adapter bracket that couples to the tray and mates with the electronic device.

20 Claims, 17 Drawing Sheets

RACK KIT

BACKGROUND

A computer (e.g., server, workstation, etc.) may be installed in a rack framework. The rack generally has multiple mounting slots or bays to hold a hardware unit having the computer secured in place (e.g., with screws) in the rack. The rack computer or server typically has a low-profile enclosure, in contrast to a tower server, for example, which is typically built into an upright, standalone cabinet. A single rack can contain multiple computers stacked one above the other, consolidating network resources and reducing the required floor space. The rack computer configuration also generally facilitates cabling among network components, for example.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Embodiments provide components of a server rack kit for installing, loading, and unloading an electronic device, such as a computer, server, workstation, and the like, into a rack, such as a server rack. Components of the rack kit may include: (1) a tray; (2) rails; and (3) an adapter bracket, and so forth. The tray may be lockable in that the tray may include at least one latch that engages an indentation of the rails. Moreover, the rails may be fixed rails and depth adjustable, as discussed below. A plurality of different adapter brackets may provide for customization of the rack kit to specific electronic devices, such as to a particular model of workstation).

Certain embodiments may be directed to a depth adjustable, fixed rail, multi-platform rack kit. In particular, the rack kit may include: (1) a locking tray; (2) an interchangeable system adapter brackets that secures to the electronic device (e.g., server, computer, workstation); and (3) adjustable fixed-rails that attach to racks, for example, 19-31 inches deep. The kit may provide for flexibility and facilitate installation and removal of the electronic device from the rack. The kit may provide a rack mount solution for use with a variety of computers or workstations. In embodiments, by incorporating interchangeable system adapter brackets, the kit provides a customizable platform for future computer or workstation rack mounting needs. Moreover, the tray features may include one or more catches, for example, latches, located underneath the installed electronic device that reduces accidental or inadvertent unloading of the electronic device which could damage the electronic device. Embodiments of the kit may provide a low-profile design with reduced impact on space constraints, facilitating high density rack configurations.

Figure 1:
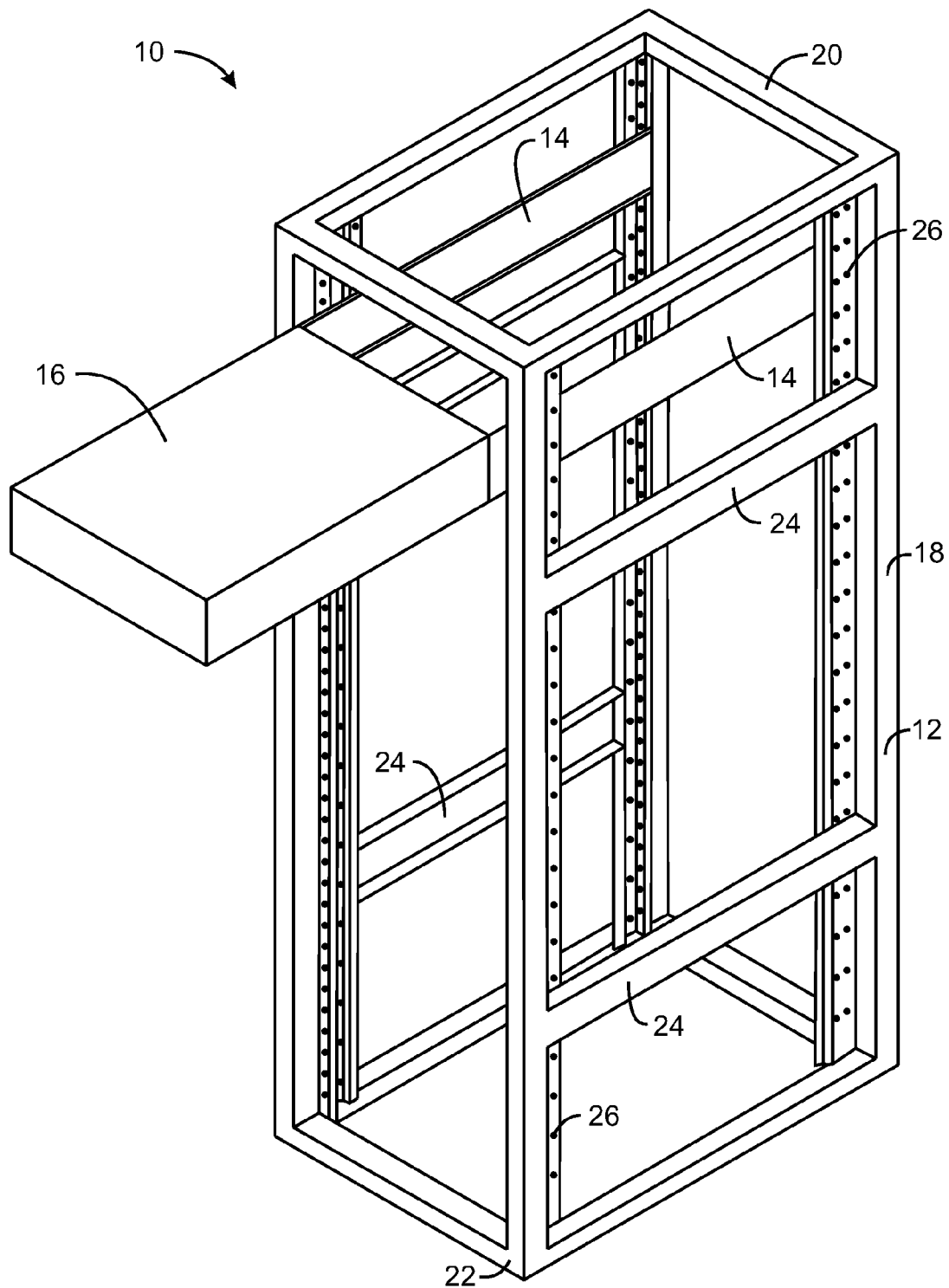
FIG. 1 is a perspective view of a server rack system having a server rack and a computer (e.g., server, workstation, etc.) in accordance with embodiments.

FIG. 1 is a server rack system 10 including a server rack 12 having attached rails 14 for receiving an electronic device such as a computer, server, a workstation, and other electronic devices. As discussed, the rails 14 may be components of a server rack kit. The server rack 12 has posts or legs 18, a top portion 20, a bottom portion 22, and bracing 24. The server rack 12 in FIG. 1 is an example and may be a cabinet, have walls or service panels, and have components for thermal management, ventilation, cooling, and so on. Further, management software may provide for monitoring power consumption and thermal output within the rack 12. Different types and variations of server racks 12 may be employed. An exemplary rack standard is Electronic Industries Association EIA-310.

The width of a mounting slot in the server rack 12 may be a standard 19 inches or a standard 23 inches, for example, or any other width sizes. An exemplary unit of measurement for rack 12 height is a rack unit, referred to as a "U" which equals about 1.75 inches. The overall height of a server rack 12 may be described in units of U, such as "42U" for example. Similarly, the height of computers 16 or other electronic devices installed into the rack 12 may be described in units of U, such as 1U, 2U, 3U, 4U, 5U, and so on.

The legs 18 may have holes 26 which facilitate installation and securing the electronic device 16 into the racks 12. The types of holes 26 for racks 12 may vary based on manufacturer, application, and so on, and may be according to the EIA-310 rack specification. The holes 26 may be unthreaded holes, threaded holes, round holes, square holes, and so on. In certain embodiments, the holes 26 may be at regular intervals and be in horizontal pairs with a center-to-center distance. The holes 26 in the legs 18 may be arranged vertically in repeating sets of three, with the pattern repeating every U (1.75 inches), for example.

Figure 2A:
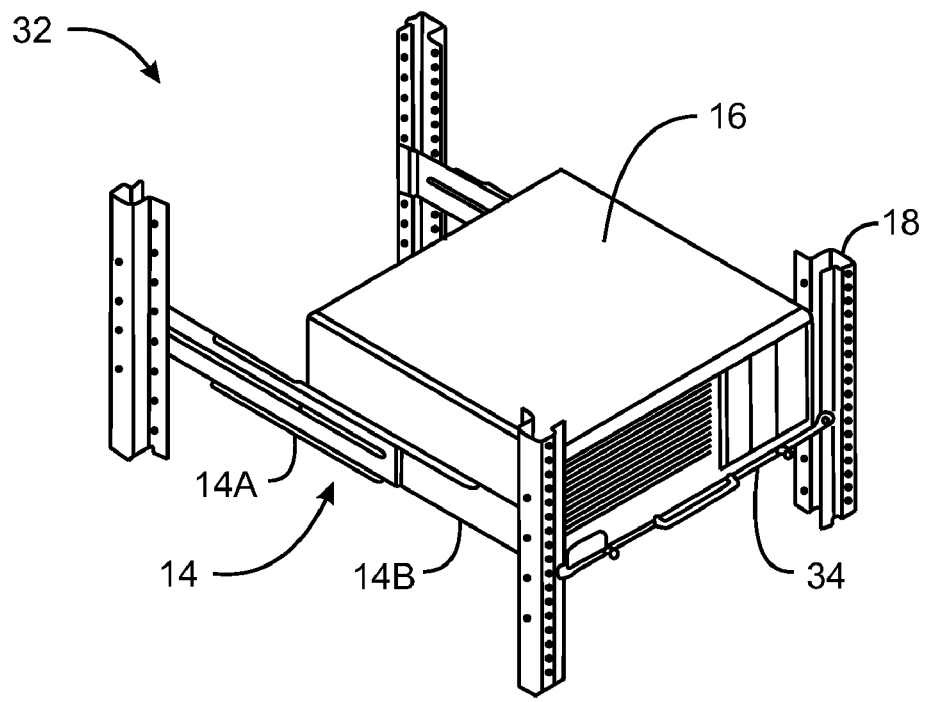
FIG. 2A is a perspective view of a portion of the server rack system of FIG. 1 depicting the computer in an inserted position.
Figure 2B:
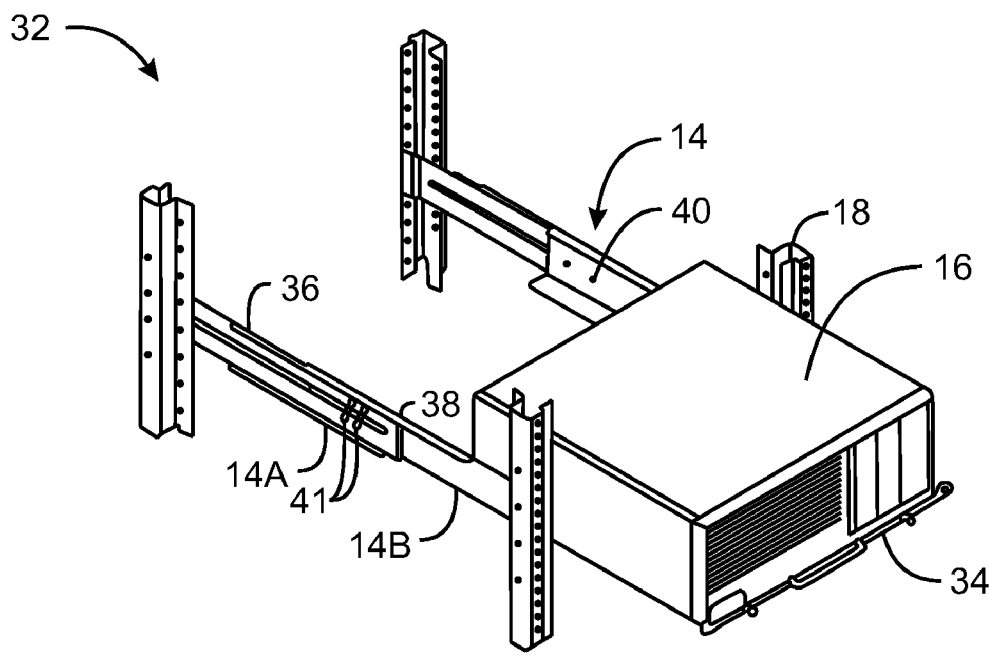
FIG. 2B is a perspective view of a portion of the server rack system of FIG. 1 depicting the computer in an extended position.

FIG. 2A is a portion 32 of the server rack system 10 of FIG. 1 depicting the electronic device 16 in an inserted position. The rails 14 are shown as two parts 14A and 14B coupled to each other and to the legs 18 of the server rack 12. The rail parts 14A and 14B facilitate receiving and securing the electronic device 16 to the server rack 12. In certain embodiments, the rails 14A and 14B may be components of a server rack kit. FIG. 2B depicts the electronic device 16 in a position extended from the server rack 12. The rail parts 14A and 14B may be coupled together via lips 36 and 38. The rail parts 14A and 14B may be secured, for example, by bolting in holes 40, which may be secured with two wing-nuts 41.

Components of a rack kit may include a tray, rails 14A and 14B, an adapter bracket, and a latch. As indicated, the rack kit may provide for configuring dense server solutions and address challenges of rack-mounting workstations where space constraints exist. In some embodiments, the kit provides for rack mounting of products, such as electronic devices 16 including computers, workstations, servers, and other rack mountable devices into a 2U space or greater, while only increasing the vertical offset by about 5 mm, for example. Additionally, the kit may include tool-less system adapter brackets that are interchangeable, so to fit future products. In certain examples, the product or electronic device 16, itself, fits in an approximate 17.65 inches×17.70 inches footprint. With regard to accessibility, such as when unloading the electronic device 16 for service or maintenance, there is a potential for dropping the assembly, risking damage to the electronic device 16. In certain embodiments, the kit features a captive tray, or shelf, which adds stability to the assembly. In some examples, the tray features two catches or latches on the bottom of the tray which are released to complete the unloading process. Moreover, again, the kit may provide for customization and provisions for forward-compatibility.

Figure 3:
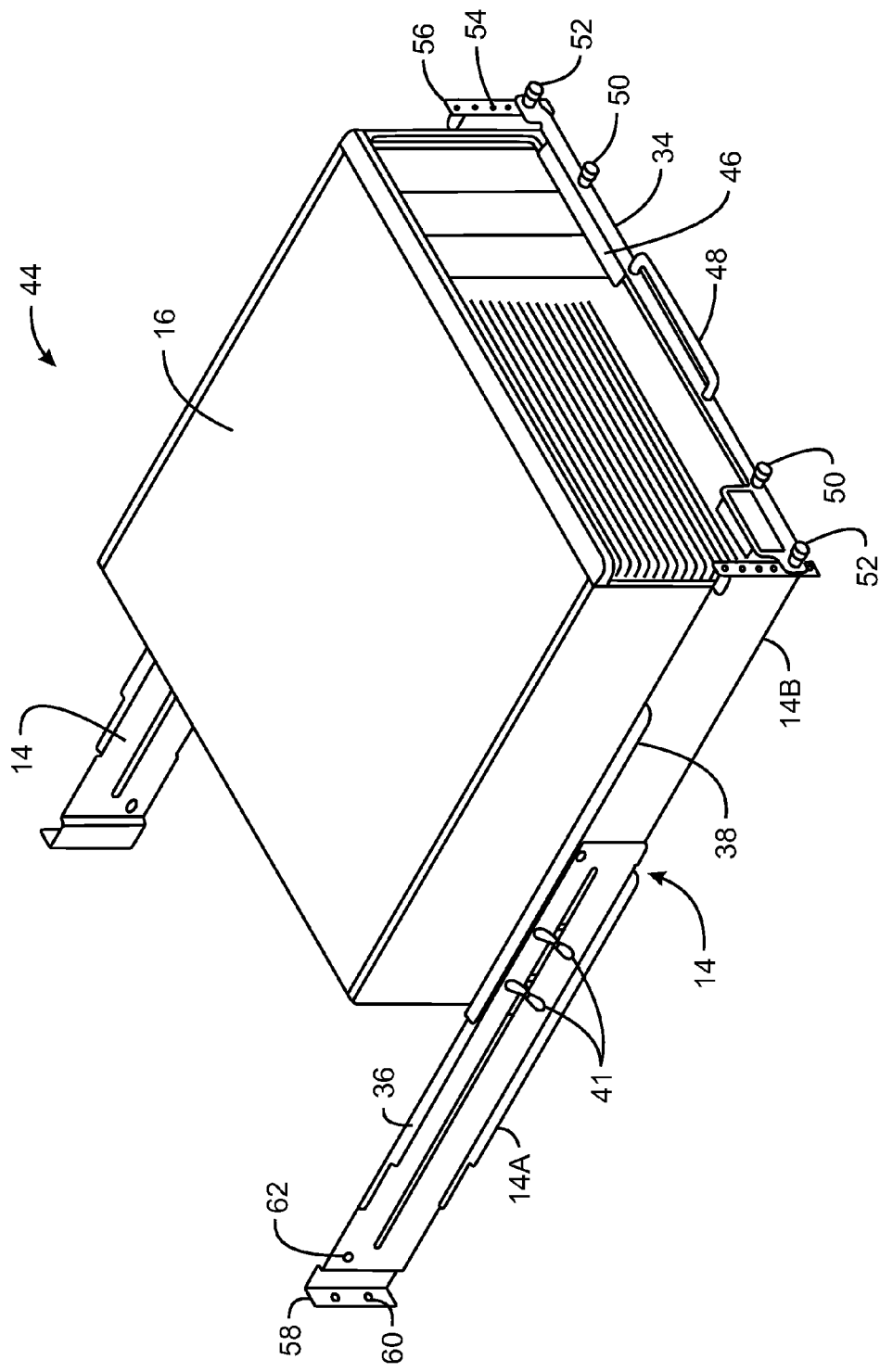
FIG. 3 is a perspective view of a computer coupled to components of a rack kit for installation of the computer into a server rack in accordance with embodiments.

FIG. 3 depicts an assembly 44 fitted with the rails 14. The assembly 44 includes the electronic device 16, the tray 34, and the adapter bracket 46. The electronic device 16 is mounted to the tray 34. Screws 50 couple the front portion of the tray 34 to the adapter bracket 46 (FIGS. 5A-5C and 6) disposed between the electronic device 16 and the tray 34. In embodiments, the screws 50 may be captive screws of the tray 34 to provide for tool-less installation of the adapter bracket 46 to the tray 34. Moreover, the tray 34 may have one or more handles 48 for inserting and removing the tray 34 (and assembly 44) from the rails 14 and the server rack 12. Further, screws 52, such as captive screws, may couple the tray 34 to the rails 14B and also to the rack 12. Holes 54 on a front portion 56 of the rails 14 may receive the screws 52. Holes 58 on a rear portion of the rails 14 may be use to couple the rails 14 to the rack 12, such as via screws or bolting to the holes 28 on the legs 18 of the rack 12 (FIG. 1). Further, holes 62 on the side of the rails 14 may facilitate coupling of the rails 14 to the rack 12.

In certain embodiments, the rails 14 are two parts 14A and 14B coupled to each other via lips 36 and 38 and secured with two wing-nuts 41 per rail 14. In the illustrated embodiment, the rail parts 14B are mirrored parts, and the rail parts 14A are the same part. The rail parts 14A and 14B, tray 34, and adapter bracket 46 may be part of a rack kit, such as a server rack kit for mounting the electronic 16 into the rack 12.

Figure 4:
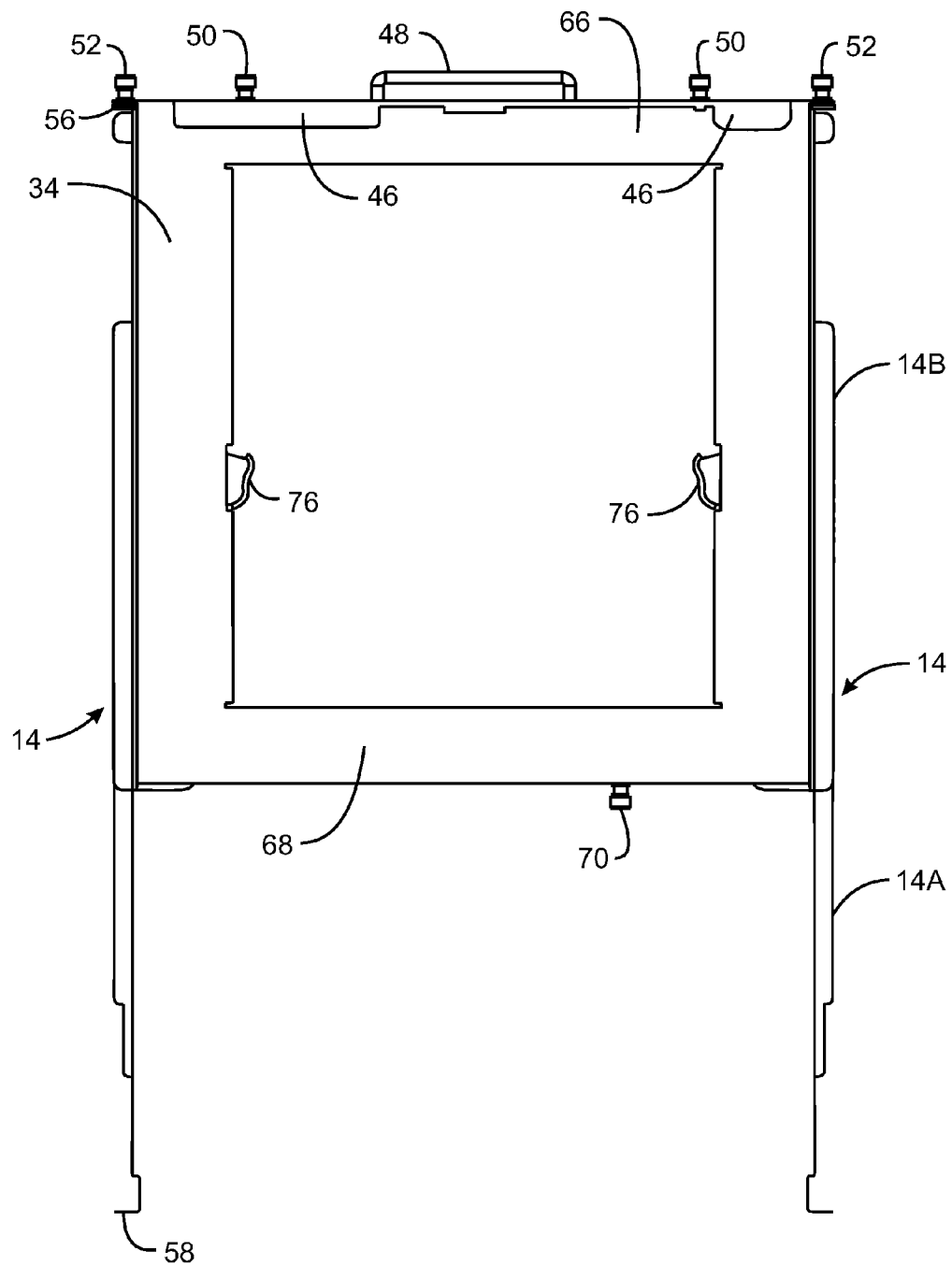
FIG. 4 is a top view of a tray and other components of a server rack kit in accordance with embodiments.

FIG. 4 is a top view of the tray 34 having a front 66 and rear 68. The tray 34 rides on the rails 14. Further, in the illustrated embodiment, a screw 70 (e.g., a captive screw of the tray 34) couples the rear 68 of the tray 34 to the electronic device 16 depicted in FIGS. 1-3. Also, screws 52, such as captive screws with tray 34, couple the tray 34 to the rails 14 or rail parts 14B. Lastly, as discussed below, a latch handle 76 extends from the tray 34.

Figure 5:
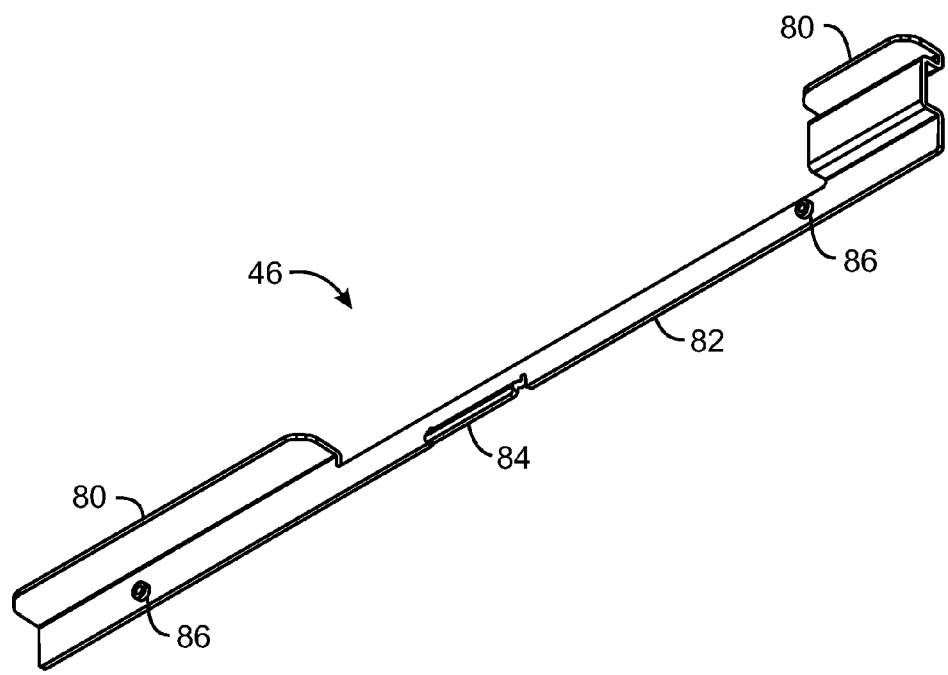
FIG. 5 is a perspective view of an adapter bracket for installing a computer into a server rack and which may be part of a server rack kit, in accordance with embodiments.

FIG. 5 is a generic adapter bracket 46 for installing an electronic device 16 into a rack 12. The adapter bracket 46 may be a part of a server rack kit. Moreover, the adapter bracket 46 may be varied to mate with different electronic devices 16. In particular, sections or portions 80 of the adapter bracket 46, for example, may be modified or fitted to meet sections or surfaces of different electronic devices 16. The adapter bracket 46 may have a body 82 and a tab 84 to facilitate coupling the adapter bracket 46 to the tray 34. Further, outer holes 86 of the adapter bracket 46 may receive the captive screws 50 (FIG. 4) of the tray 34 or receive other fastening elements for securing the adapter bracket 46 to the tray 34.

Figure 6A:
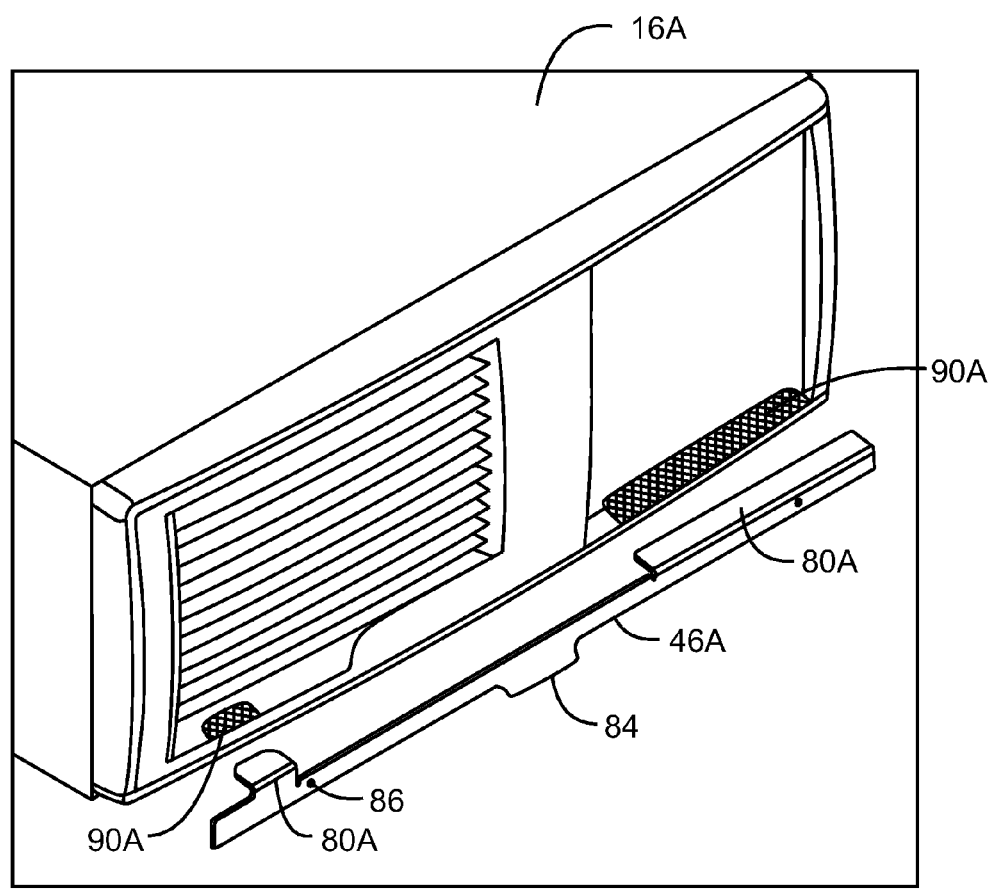
FIGS. 6A-6C are perspective views of respective different computers engaging varied adapter brackets for installing the computers into a server rack and in which the adapter brackets may be components of a server rack kit, in accordance with embodiments.
Figure 6B:
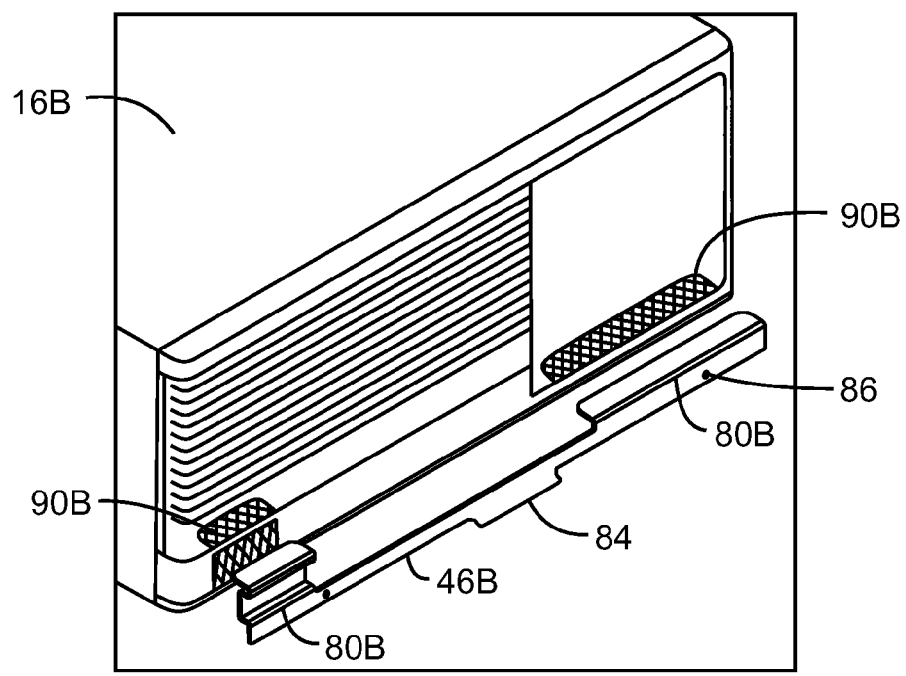
Figure 6C:
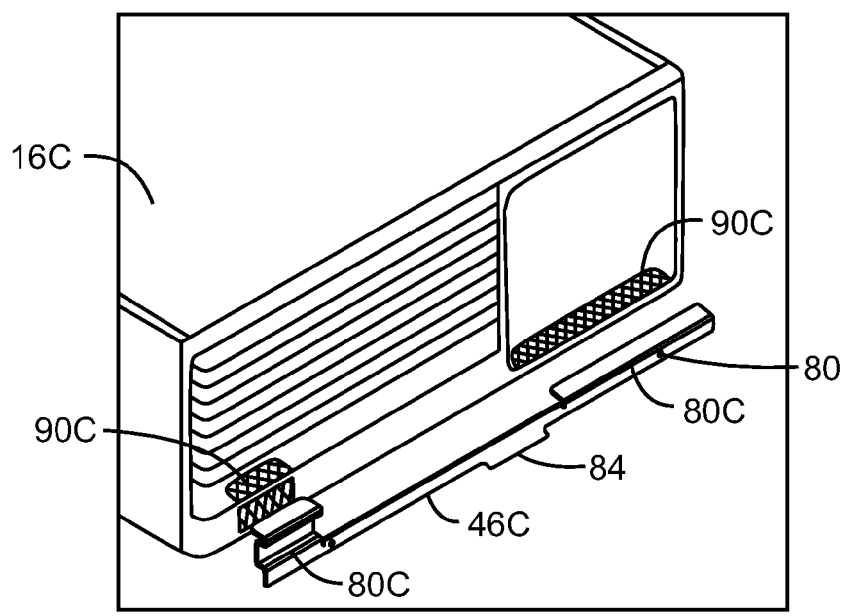

FIGS. 6A-6C depicts varied adapter brackets 46A, 46B, 46C engaging different electronic devices 16A, 16B, and 16C, such as different models of workstations. The adapter brackets 46A, 46B, 46C facilitate installing the electronic devices 16A, 16B, and 16C into a rack 12. Portions 80A, 80B, 80C of the adapter brackets 46A, 46B, 46C meet surfaces 90A, 90B, 90C, respectively, of the different electronic devices 16A, 16B, and 16C. The adapter brackets 46A, 46B, 46C may be components of a server rack kit.

Figure 7:
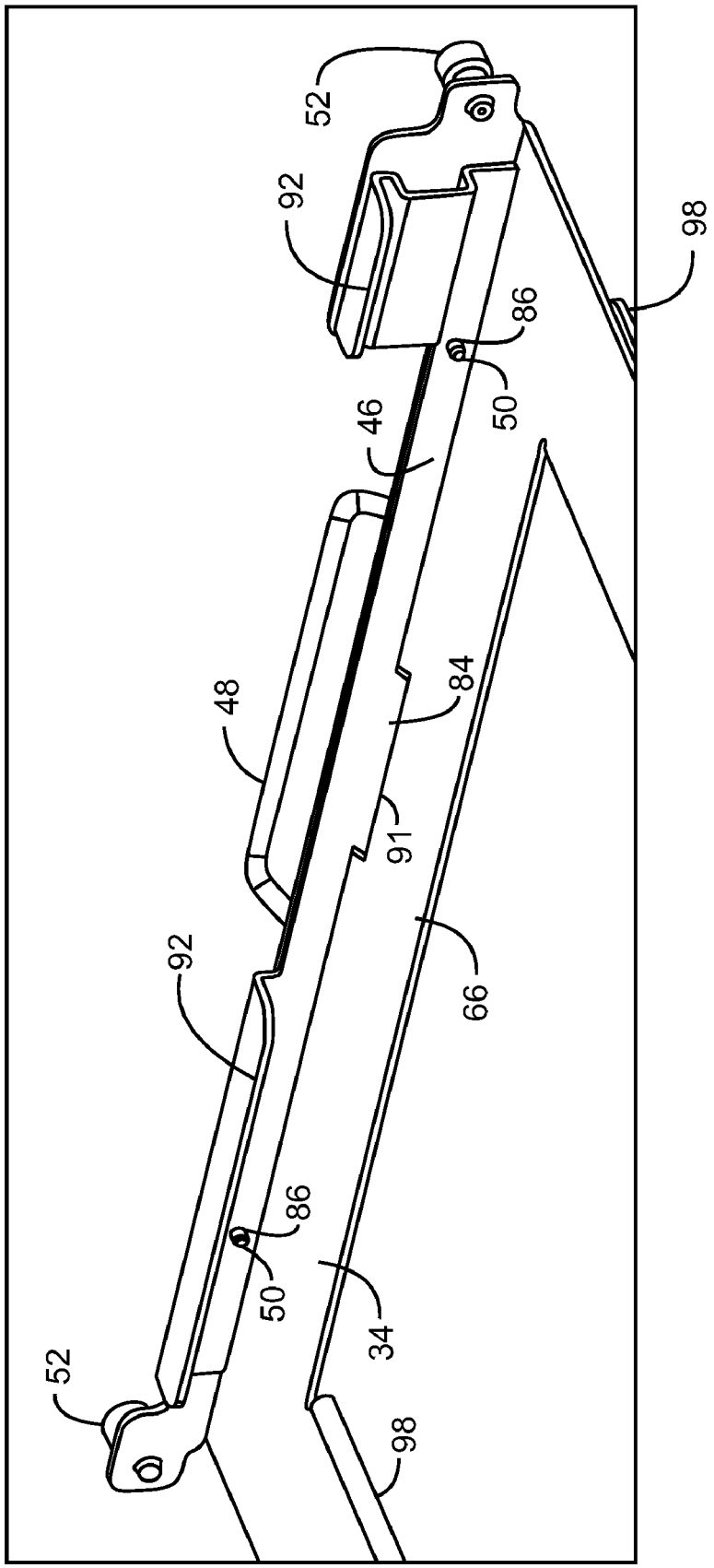
FIG. 7 is a perspective view of an adapter bracket installed on a front portion of a tray, both (the adapter bracket and tray) for installing a computer into a server rack and which both may be components of server rack kit, in accordance with embodiments.

FIG. 7 is an adapter bracket 46 installed on a front portion 66 of a tray 34 for installing an electronic device 16 into a rack 12. Again, the tray 34 and bracket 46 may be components of a rack kit. In embodiments, the tab 84 in the adapter bracket mates with a slot 91 in the tray 34. The captive screws 50 of the tray 34 mate with the outer holes 86 of the adapter bracket 46. Captive screws 52 of the tray 34 secure the tray to the rails 14 and/or rack 12. Further, the handle 48 of the tray 34 is depicted. Furthermore, a dampening material 92 may be placed on the portions 90 of the adapter bracket 46 that contact the electronic device 16. The dampening material 92 may reduce cosmetic marring of the electronic device 16 when in contact with the adapter bracket 46. Lastly, as discussed below, the tray 34 has a lip or hem 98.

Figure 8:
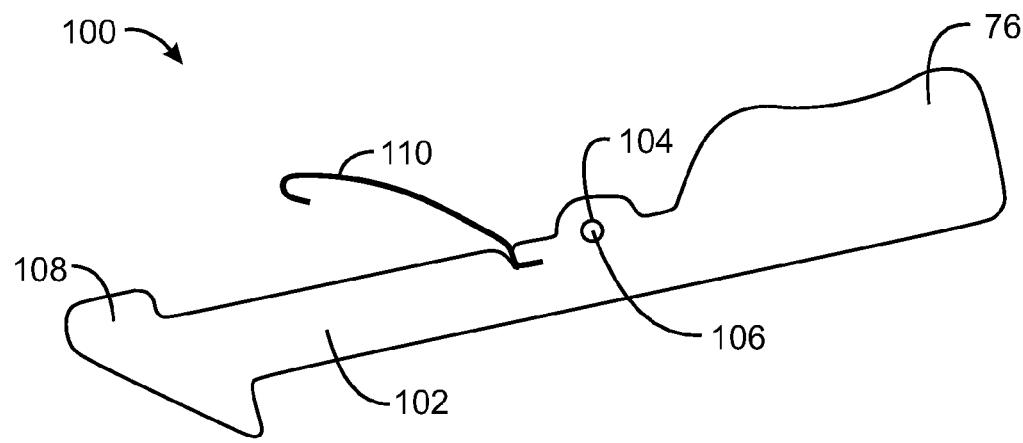
FIGS. 8 and 9 are perspective views of a latch for securing a computer in a server rack and which may be part of a server rack kit, in accordance with embodiments.

FIG. 8 depicts a latch 100 for securing the electronic device 16 in the rack 12 and which may be part of a rack kit. The latch 100 has an arm 102 and whole 104 in the arm 102 for receiving a pin 106. Further, the arm 102 of the latch 100 has a handle 76 (see also FIG. 4) and a head 108. A spring 110, such as a leaf spring, provides for the tension in operation of the latch 100.

Figure 9:
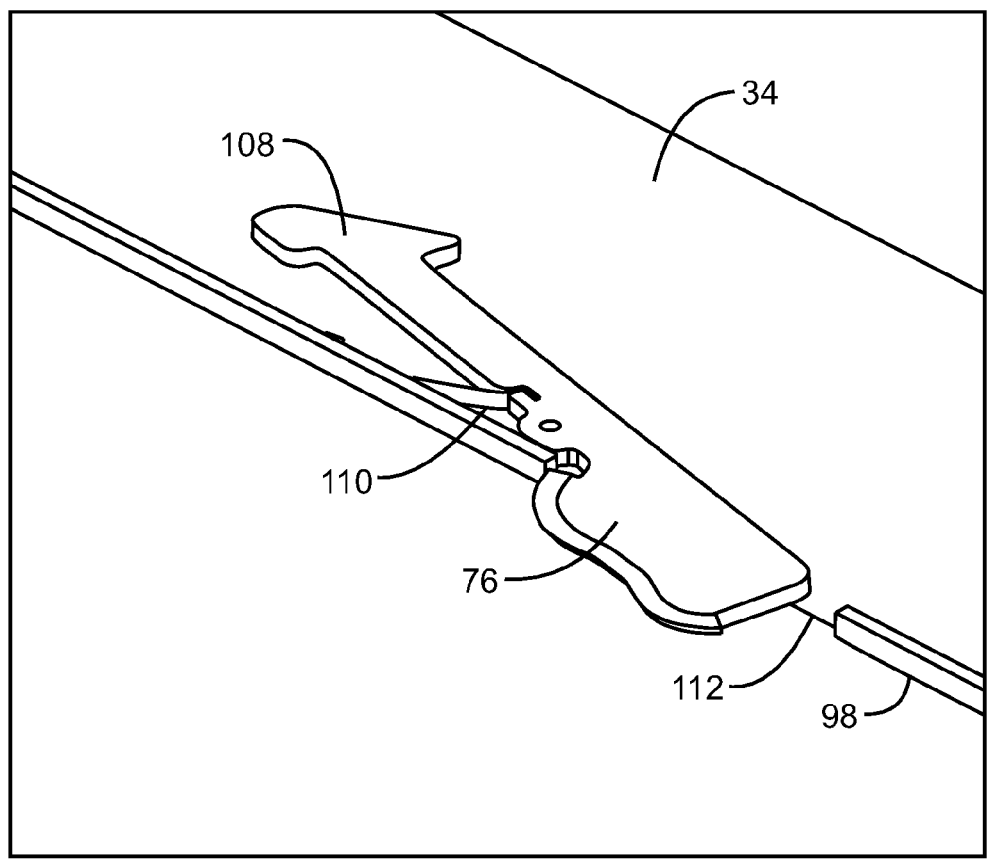

FIG. 9 depicts the latch 100 disposed in the hem 98 of the tray 34. For access, the handle 76 of the latch 100 extends from the hem 98, through an opening 112 of the hem 98, into the space interior of the tray 34. Again, in this embodiment, the latch 100 utilizes the leaf spring 110, for example, spring steel, to return the latch 100 to an engaged position. The latch 100 including the spring 110 are sandwiched between the two layers of the hem 98 and held in place by the pin 106, such as a press-fit pin.

Figure 10:
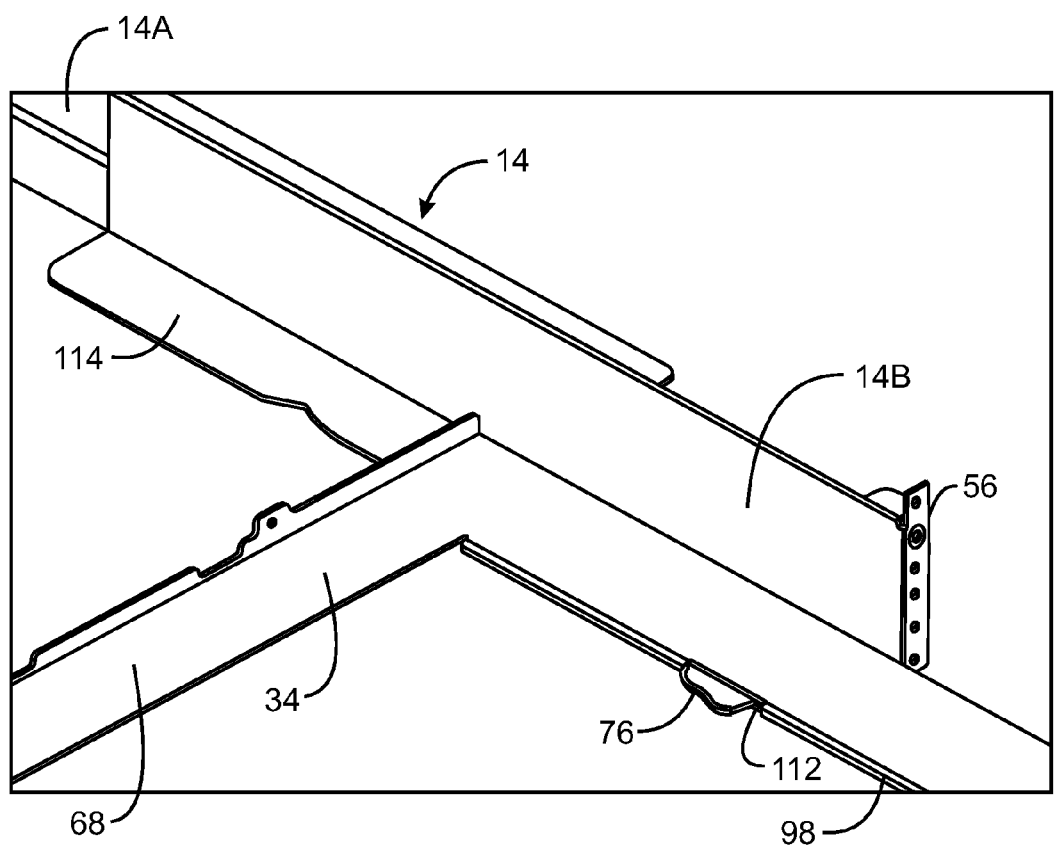
FIG. 10 is a perspective view of the latch of FIGS. 8 and 9 associated with a tray and rail in accordance with embodiments.

FIG. 10 shows the handle 76 of the latch 100 extending through an opening 112 of the hem 98 of the tray 34. In operation, the tray 34 rides on a surface 114 of the rail 14, such as of rail part 14B.

Figure 11A:
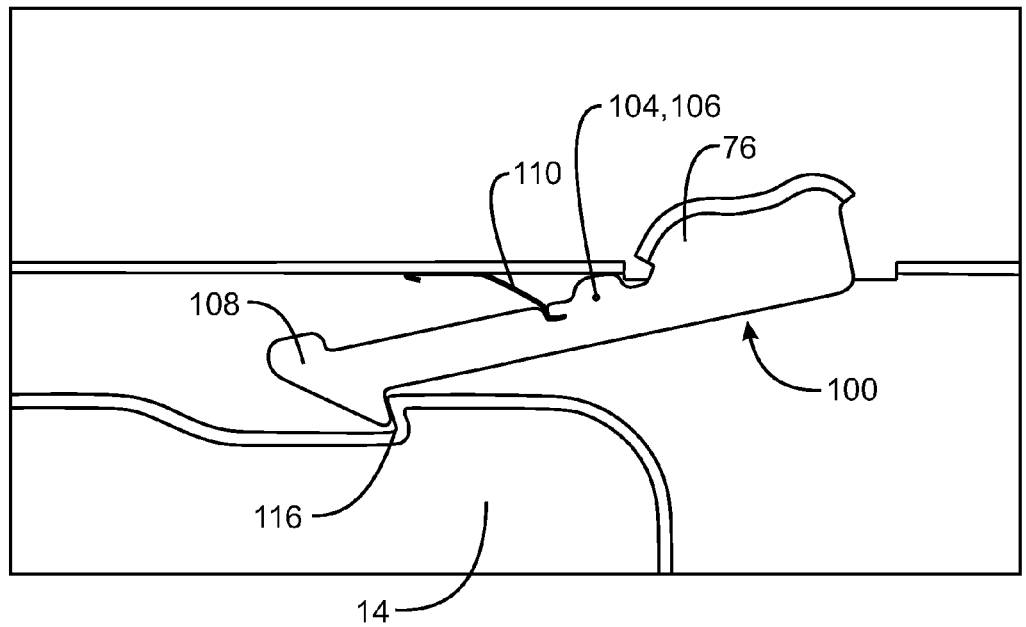
FIGS. 11A and 11B are top cross-sections of the latch (of FIGS. 8-10) engaged and disengaged, respectively, with a rail in accordance with embodiments.
Figure 11B:
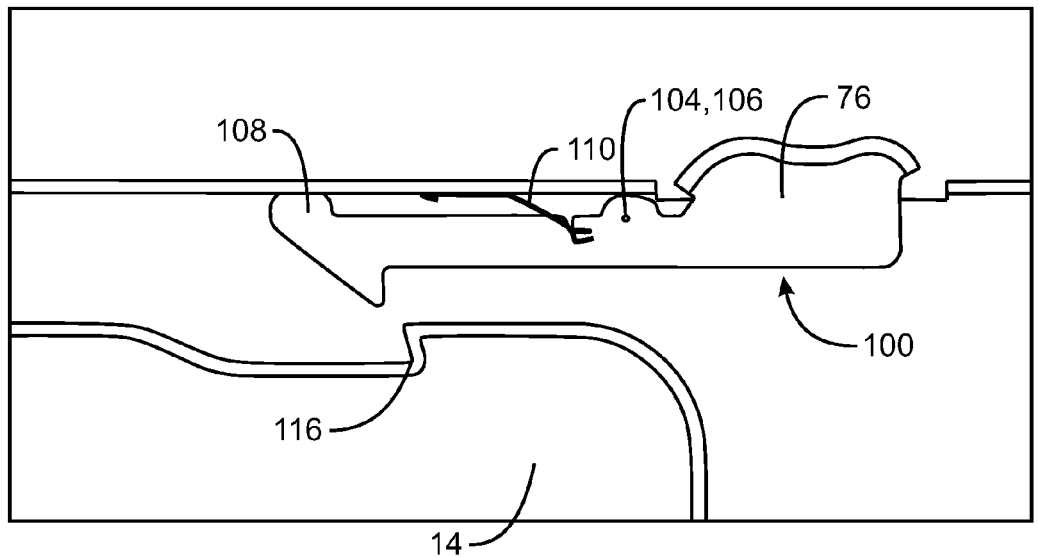

FIGS. 11A and 11B are top cross-sections of the latch 100 in the hem 56 of tray 34. FIGS. 11A and 11B depict the head 108 of the latch 100, engaged and disengaged, respectively, with an indentation 116 of the rails 14 (14B). To release the latch 100 and facilitate removal of the tray 34 from the rack 12, the handle 76 of the latch 70 may be pressed or activated to disengage the head from the indentation 116 of the rail 14. Again, for accessibility, the handle 76 of the latch 100 extends from the hem 98 of the tray 34.

Figure 12:
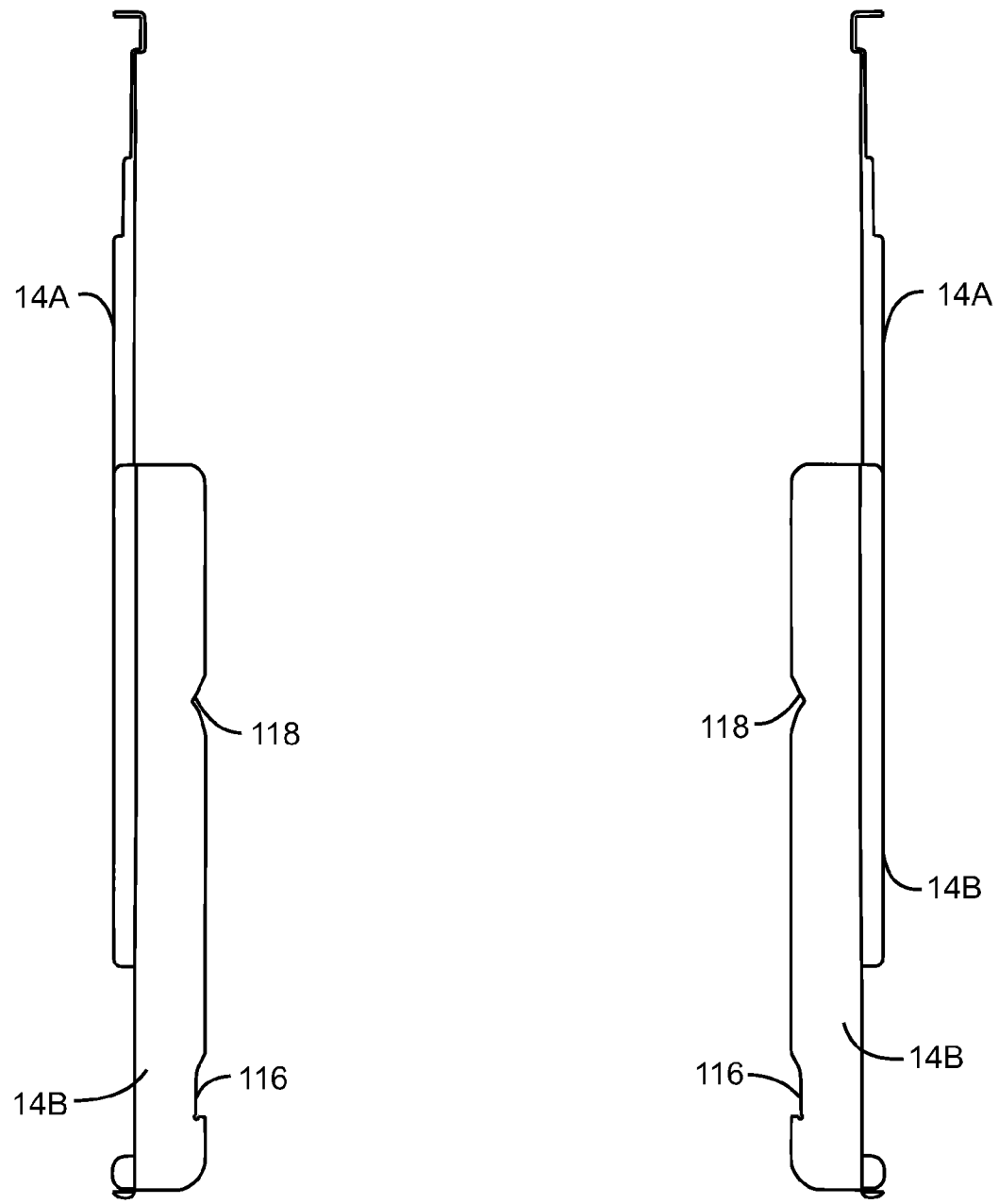
FIG. 12 is a top view of rails having latching features and which may be components of a server rack kit, in accordance with embodiments.

FIG. 12 is a top view of the rails 14 having latching features 116 and 118. The indentation 116 in the rail 14 (14B) receives the head 108 of the latch 100. A second indentation 118 in the rail 14 (14B) is provided for the head 108 to rest when the tray 34, carrying the mounted electronic device 16, is inserted into the rack 12.

Figure 13A:
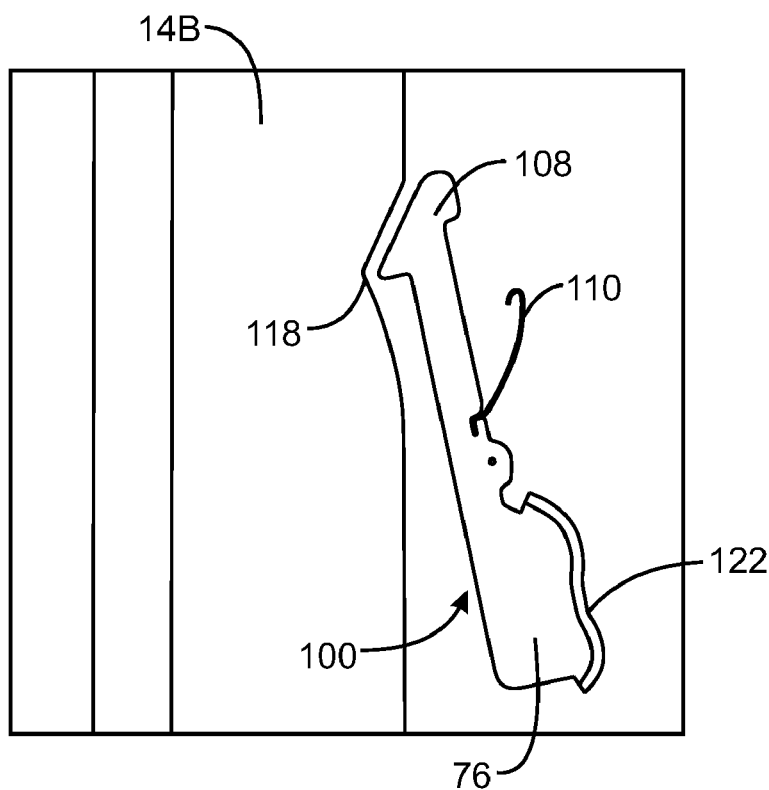
FIGS. 13A and 13B are diagrammatical representations of a latch, disengaged and engaged, respectively, with a rail in accordance with embodiments.
Figure 13B:
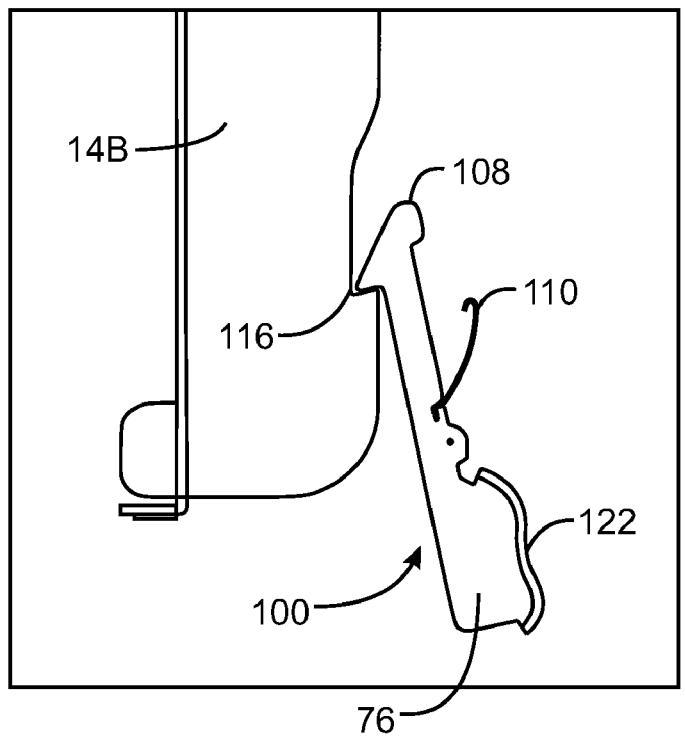

FIGS. 13A and 13B depict the latch 100, disengaged and engaged, respectively, with the rail part 14B. It should be noted that the handle 76 may have a gripping surface 122.

Figure 14:
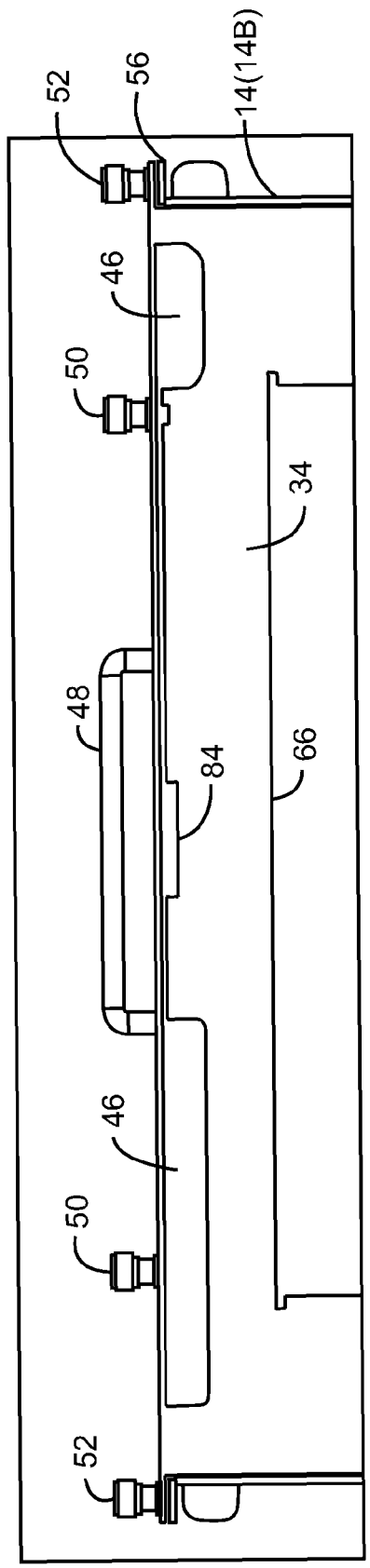
FIG. 14 is a top view of a front portion of a tray having an installed adapter bracket for installing a computer into a server rack in accordance with embodiments.
Figure 15:
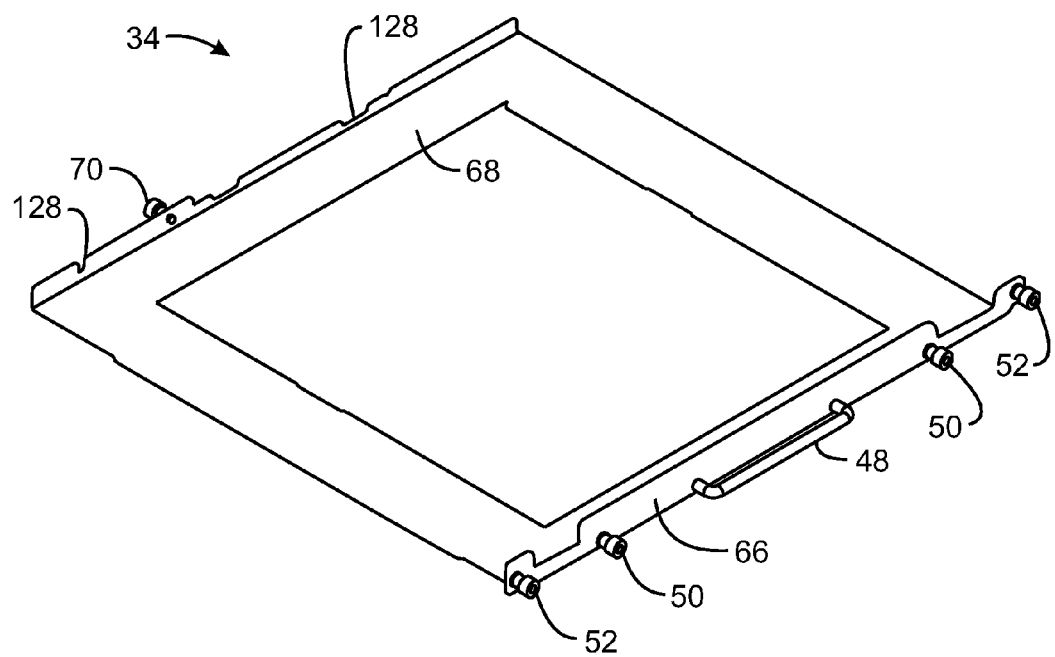
FIG. 15 is a perspective view of a tray having captive screws for installing a computer into a server rack in accordance with embodiments.

FIG. 14 is a top view of the front portion 66 of the tray 34, with the adapter bracket 46 installed. Captive screws 50 of the tray 34 and tab 84 of the tray 34 secure the tray 34 to the adapter bracket 46. Captive screws 52 of the tray 34 secure the tray to a front portion 56 of the rails 14 or to the rack 12. FIG. 15 depicts the tray 34 with the various captive screws 50, 52, and 70. In this example, the captive screws 50 are used to attach the adapter bracket 46 to the tray 34. Captive screws 52 are used to secure the tray 34 to the rails 34 when the tray is in an installed position in the rack 12. The rear captive screw 70 is used to mount and secure the electronic device to the tray 34. Further, the tray 34 may include additional features 128 to facilitate mounting of the electronic device 16 and installation of the tray 34 into the rack 12.

In sum, embodiments of the depth-adjustable fixed-rail rack kit may facilitate installation of various computers or workstations 16 in different kinds of racks 12. The kit may include fixed-rails 14, a locking tray 34, and system adapter brackets 46. A workstation 16 system may be secured in a substantially horizontal position with fixed rails 14 on the locking mounting tray 34. In one embodiment, the rack kit is applicable to xw4X00/Z2X0/Z4X0 workstations available from HEWLETT PACKARD (HP) Corporation. However, the rack kits are not limited to these workstations, but may be used for mounting any type of rack mountable equipment. The fixed rails 14 provide a relatively stable platform for rack mounting and attach to the rack 12 using a provided hardware kit, for example. The locking tray 12 attaches to the workstation 16 using captive screws and the system adapter bracket 46 specific to the given workstation. The workstation 16 is slid into the rack 12 so the fixed-rails 14 are held captive by the tray 34 and secured using the outer captive screws 52 (see FIG. 4) in this example. As discussed, the tray 34 may feature one or more catches, for example, latches 100 (FIG. 8), located underneath the workstation 16, for added security. In one example, two catches, such as latches 100, are employed. In all, advantages may include added accessibility features to reduce dropping or damage to the computer or workstation 16, interchangeable systems adapter brackets 42 to facilitate the kit to be used with a variety of current and future workstations 16, and tool-less loading/unloading of the workstation 16, and of the tray 34 assembly, from the rack 12.

Figure 16A:
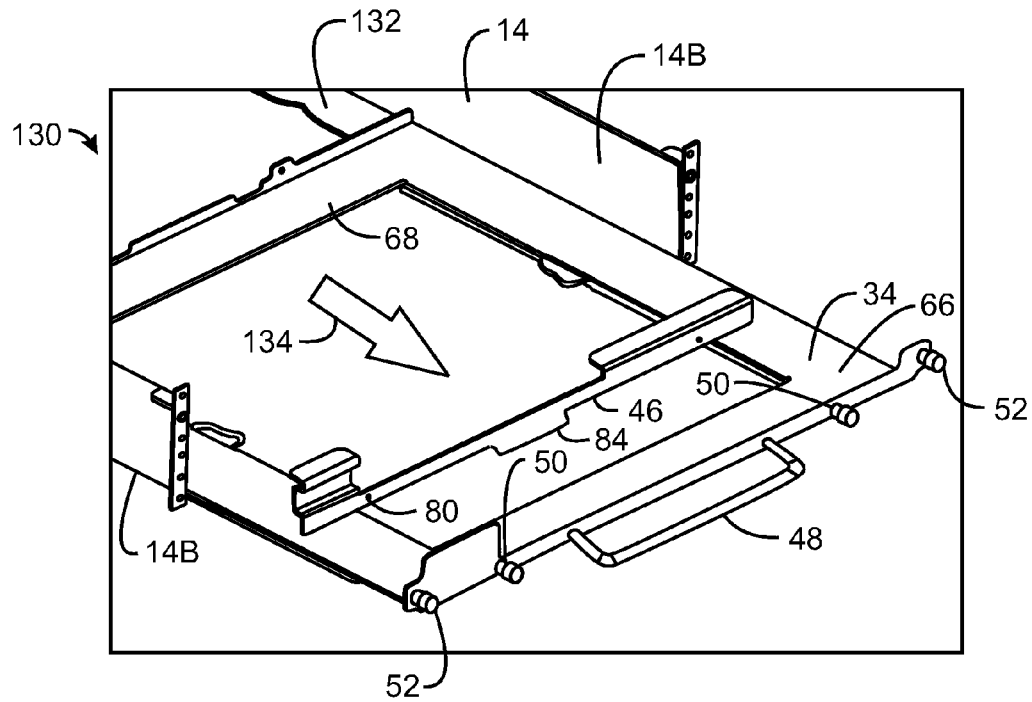
FIGS. 16A and 16B are perspective views of mounting a computer onto components of a server rack kit for installing the computer into a server rack in accordance with embodiments.
Figure 16B:
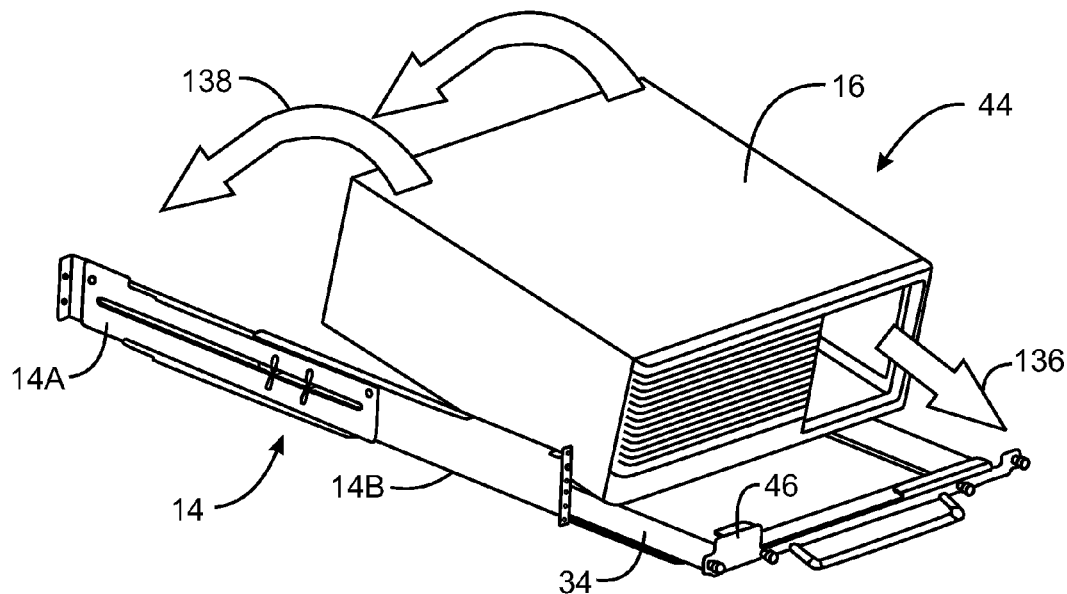

FIGS. 16A and 16B depict mounting an electronic device 16 onto components, including rails 14, tray 34, adapter bracket 46, and latch 100, of a rack kit 130 for installing the electronic device, such as the computer 16, into the rack 12. In FIG. 16A, a rack kit 130 includes the tray 34, rails 14 (14A and 14B), and the adapter bracket 46. The tray 34 rests on the rails 14. The adapter bracket 46 is mated with the front portion 36 of the tray 34, as depicted by arrow 134. FIG. 16B depicts an assembly 44 being formed of the electronic device 16, the tray 34, and the adapter bracket 46, with the assembly 44 to ride on the rails 14. In FIG. 16B, the front portion of the electronic device 16 is placed and moved forward onto the tray 34, as depicted by arrow 136. The back portion of the electronic device 16 is moved down (arrows 138) onto the tray 34 as the electronic device 16 is moved forward (arrow 136) in the tray 34. The captive screw 70 (FIG. 15) of the tray 34, and the adapter bracket 46, may be used to secure the electronic device 16 to the tray 34.

During installation, the rails 14 are attached to the rack 12, such as with screws. Initially, the two rail parts 14A and 14B of each rail 14 are coupled to each other with screws, bolts, etc., or the parts 14A and 14B may be coupled together screw-less, such as with one part 14A or 14B fitting in a lip of the other part 14A or 14B, for example. The amount of overlap between the two parts 14A and 14B of each rail 14 may be adjusted to provide for depth-adjustability of the rack kit for different sizes of racks 12.

Further, during installation, the appropriate adapter bracket 46 is selected, for example having a machine stamp that matches the workstation 16 model. To install the adapter bracket 46 onto the tray 34 in one example, the tab 84 of the adapter bracket 46 is fit into a hole or slot 91 on the tray 34, as described in relation to FIG. 7. The adapter bracket 46 is further secured with the two captive screws 50 (FIG. 4) of the tray 34 into holes 86 (FIG. 6) of the adapter bracket 46. The rear captive screw 70 (FIG. 4) of the tray 34 is loosened to be used to secure the rear of the electronic device 16, once the electronic device 16 is seated in the tray 34.

Again, as indicated with respect to FIGS. 16A and 16B, a front portion or bezel of the electronic device 16 may be guided under a lip of the adapter bracket 46. The back of the workstation 16 may be rotated down onto the tray 34. One or more rear captive screws 70 may be tightened to secure the rear of the workstation 16 into the tray 34. The rear of the workstation-tray assembly 44 is slid into the rack 12 on the rails 14 (bracket shelf), maintaining that the rail 14-bracket shelf is engaged by the lip on the underside of the tray 34. The assembly 44 is further secured into the rack 12 by tightening the outermost captive screws 52 of the tray 34 to the rack 12 or rails 14.

Thus, embodiments provide a rack kit 130 including a first rail 14 that couples to a first side of a rack 12 and a second rail 14 that couples to a second side of the rack 12, wherein the first rail 14 and the second rail 14 each include a first part 14A and a second part 14A that overlap for depth adjustability into the rack 12. The rack kit 130 includes a tray 34 that receives an electronic device 16 to be installed into the rack 12. The tray 34 is slidably fitted with the first rail 14 and the second rail 14, wherein the tray 34 includes a first latch 100 to engage the first rail 14 and a second latch 100 to engage the second rail 14, and wherein the first rail 14 and the second rail 14 are fixed rails relative to the rack 12. Furthermore, the rack kit 130 includes an interchangeable adapter bracket 46 that couples to a front portion 66 of the tray 34 to mate with a front portion of the electronic device 16, wherein the interchangeable adapter bracket 46 is pre-modified to have sections 80, 80 A, B, C that mate with sections 90 A, B, C of the electronic device 16.

Figure 17:
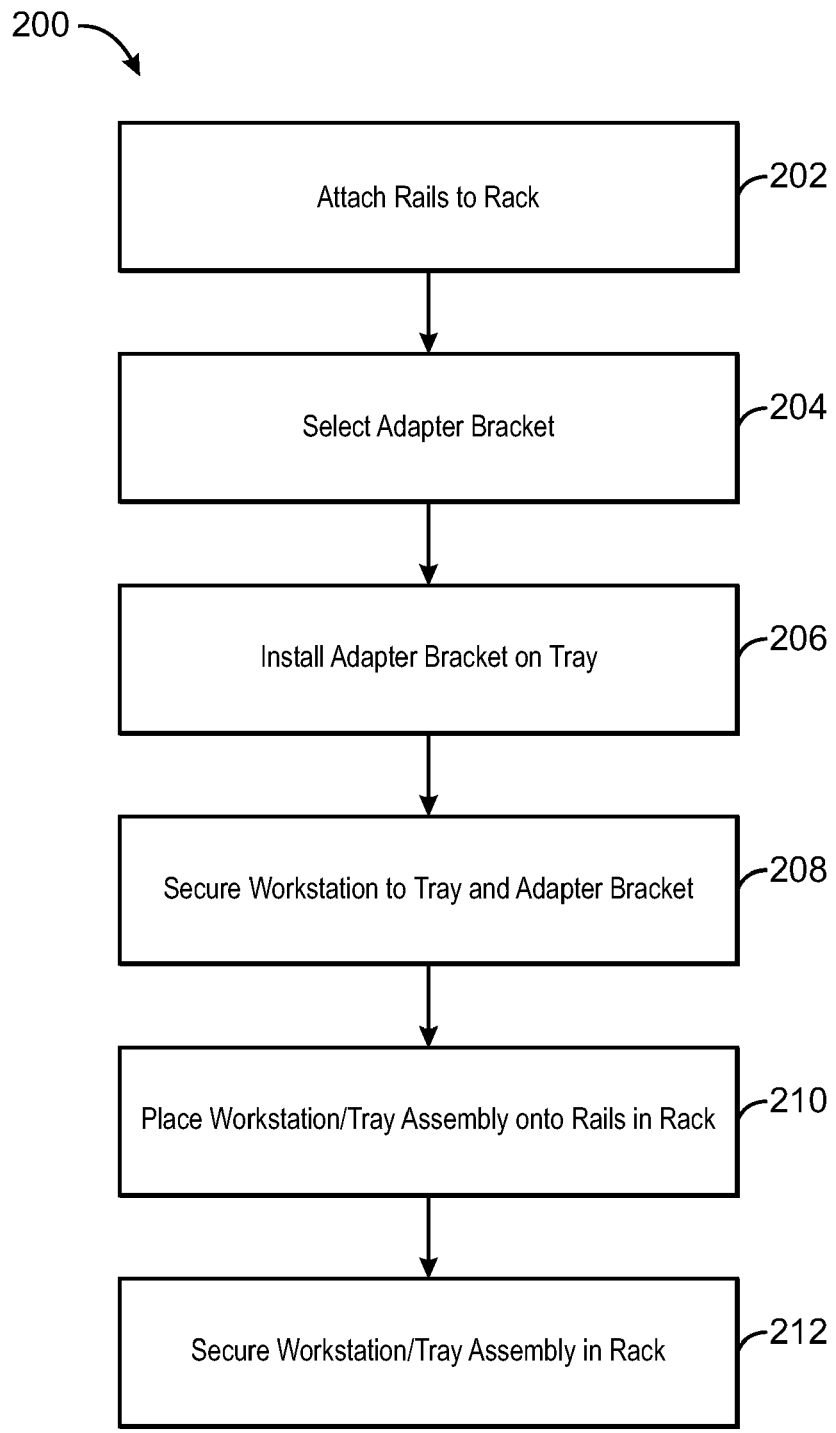
FIG. 17 is a block diagram of a method for mounting a computer onto components of a server rack kit for installing the computer into a server rack in accordance with embodiments.

FIG. 17 is a method 200 for using a rack kit 130 having rails 14, a tray 34, and an adapter bracket 46 for installing an electronic device 16, such as a workstation) into a rack 12, such as a server rack. The rails 14 are installed (block 202) on the rack 12. As discussed, an overlap of the rail parts 14A and 14B of each rail 14 may be altered to adjust the depth of the rails 14 into the rack 12. An adapter bracket 46 is selected (block 204) for the particular electronic device 16. The adapter bracket 46 is installed (block 206) on the tray 34, such as with the tab 84 and the captive screws 50 of the tray 34. The electronic device 16, such as the workstation, is secured (block 208) to both the tray 34 and the adapter bracket 46. A rear captive screw 70 of the tray 34 may be used to secure the electronic device 16 to the tray 34. As discussed, the front portion of the electronic device 16 may mate with the selected adapter bracket 46 installed on the tray 34. The assembly 44 of the electronic device 16, tray 34, and adapter bracket 46 may be placed (block 210) onto the rails 14 and slid into the rack 12. The assembly 44 may be secured (block 212) in the rack 12 via the outermost captive screws 52 of the tray, for example. The captive screws 52 may couple the tray 34 to the rack 12 and/or rails 14.

It should be noted that upon installation of the rails 14 to the rack 12, embodiments of the rack kit 130 including the first and second rails 14, the tray 34, and the interchangeable adapter bracket 16 may provide for tool-less loading of the electronic device 16 into the rack 12 and tool-less unloading of the electronic device 16 from the rack 12. Moreover, embodiments provide for a rack system 10 including the rack 12, the electronic device 16, and the rack kit 130.

In sum, embodiments provide a method for using a rack kit 130 to install or place an electronic device 16 into a rack 12. The method includes selecting an adapter bracket 16 of the rack kit 130 for a particular model of the electronic device 16, and fastening the adapter bracket 46 to a front portion 66 of a tray 34 of the rack kit 130. The electronic device 16 is mounted on the tray 34, forming an assembly 44 of the electronic device 16, the tray 34, and the adapter bracket 46, wherein mounting the electronic device 16 on the tray 34 includes mating a front portion of the electronic device 16 with the adapter bracket 46 to facilitate securing the electronic device 16 to the tray 34. The tray 34 is slid on the rails 14 attached to the rack 12 to insert the assembly 44 of the electronic device 16, tray 34, and adapter bracket 46 into the rack 12, wherein the rails 14 are fixed relative to the rack 12. The rails 14 include a first rail 14 on a first interior side of the rack 12 and a second rail 14 on a second interior side of the rack 12 opposite the first interior side, and wherein the first rail 14 and the second rail 14 each include a front part 14B coupled to a rear part 14A.

What is claimed is:

1. A method of placing an electronic device into a rack, the method comprising:
    selecting an adapter bracket for the electronic device;
    fastening the adapter bracket to a front portion of a tray;
    mounting the electronic device on the tray, forming an assembly of the electronic device, the tray, and the adapter bracket, wherein mounting the electronic device on the tray comprises mating a front portion of the electronic device to the adapter bracket to facilitate securing the electronic device to the tray; and
    sliding the tray on rails attached to the rack to insert the assembly comprising the electronic device, tray, and adapter bracket into the rack, wherein the rails are fixed relative to the rack and comprise a first rail on a first interior side of the rack and a second rail on a second interior side of the rack opposite the first interior side, and wherein the first rail and the second rail each comprise a front part coupled to a rear part.

2. The method of claim 1, comprising:
    coupling the front part and second part of the first rail;
    coupling the front part and second part of the second rail;
    adjusting an overlap of the first part with the second part of each rail to adjust depth of the first rail and the second rail with respect to a depth of the rack; and
    attaching the first rail and the second rail to the rack, wherein the first rail and second rail are fixed relative to the rack and do not slide from the rack.

3. The method of claim 1, wherein the rear part of the first rail is a mirrored part of the rear part of the second rail, and wherein the front part of the first rail is a same part as the front part of the second rail.

4. The method of claim 1, wherein attaching the adapter bracket to the tray, mating the electronic device to the adapter bracket, mounting the electronic device on the tray, and sliding the tray on the first rail and second rail are all performed tool-less by hand.

5. The method of claim 1, wherein both installing the adapter bracket on the tray and mounting the electronic device on the tray comprise utilizing captive screws of the tray.

6. The method of claim 1, wherein the tray comprises a latch configured to engage the first rail or second rail to stop removal of the assembly from the rack unless the latch is released from the first rail or second rail.

7. The method of claim 1, comprising removing the electronic device from the rack by sliding the assembly from the rack on the first rail and the second rail and pressing a handle of a latch to disengage the latch from the first rail or second rail.

8. The method of claim 7, wherein pressing the handle of the latch to disengage the latch from the first rail or second rail comprises pressing the handle to release a head of the latch from the first rail or second rail.

9. The method of claim 1, wherein the tray comprises a first latch to engage the first rail and a second latch separate from the first latch to engage the second rail, and wherein the first rail and second rail each comprise:
    a first indentation for a head of the first latch and a head of the second latch, respectively, to rest in a disengaged position when the tray is inserted into the rack; and
    a second indentation to catch the head of the first latch and the head of the second latch, respectively, when the tray is being removed from the rack.

10. The method of claim 1, wherein the electronic device comprises a computer, a server, or a workstation, or any combination thereof.

11. A rack system comprising:
    a rack;
    a first rail coupled to a first side of the rack and a second rail coupled to a second side of the rack, wherein the first rail and the second rail are fixed relative to the rack, and wherein the first rail and the second rail each comprise a first part and a second part that overlap to provide for depth adjustability of the first rail and second rail with respect to a depth of the rack;
    a tray slidably fitted with the first rail and the second rail, wherein the tray comprises a first latch to engage the first rail and a second latch to engage the second rail;
    an adapter bracket coupled to a front portion of the tray; and
    a computer mounted and coupled to the tray in a horizontal position and mated with the adapter bracket, wherein the adapter bracket is designed for the computer by matching seating surfaces of the adapter bracket with seating surfaces of the computer.

12. The system of claim 11, wherein the tray comprises captive screws coupling a front portion of the tray to the adapter bracket and coupling the tray to the computer, and wherein at least one of the captive screws couples the tray to a rear portion of the computer.

13. The system of claim 11, wherein the first rail and second rail each comprise:
a first indentation for a head of the first latch and a head of the second latch, respectively, to rest in a disengaged position when the tray is inserted into the rack; and
a second indentation to catch the head of the first latch and the head of the second latch, respectively, when the tray is partially removed from the rack.

14. The system of claim 11, wherein:
the first latch and second latch are disposed in a hem of the tray;
the first latch comprises a first handle for operating the first latch, and the second latch comprises a second handle for operating the second latch; and
the first handle extends through a first opening of the hem for accessibility, and the second handle extends through a second opening of the hem for accessibility.

15. A rack kit comprising:
a first rail that couples to a first side of a rack and a second rail that couples to a second side of the rack, wherein the first rail and the second rail each comprise a first part and a second part, and wherein the first part and second part overlap to provide for depth adjustability of the first rail and second rail with respect to a depth of the rack;
a tray that receives an electronic device to be installed into the rack, the tray slidably fits with the first rail and the second rail, wherein the tray comprises a first latch to engage the first rail and a second latch to engage the second rail, and wherein the first rail and the second rail are fixed rails relative to the rack;
an interchangeable adapter bracket that couples to a front portion of the tray to mate with a front portion of the electronic device, wherein the interchangeable adapter bracket is modified to have sections that mate with sections of the electronic device; and
wherein upon installation of the rails to the rack, the rack kit comprising the first and second rails, the tray, and the interchangeable adapter bracket provides for tool-less loading of the electronic device into the rack and tool-less unloading of the electronic device from the rack.

16. The kit of claim 15, wherein the first rail and second rail each comprise:
a first indentation for a head of the first latch and a head of the second latch, respectively, to rest in a disengaged position when the tray is inserted into the rack; and
a second indentation to catch the head of the first latch and the head of the second latch, respectively, when the tray is partially removed from the rack.

17. The kit of claim 15, wherein:
the first latch and second latch are disposed in a hem of the tray;
the first latch comprises a first handle for operating the first latch, and the second latch comprises a second handle for operating the second latch; and
the first handle extends through a first opening of the hem for accessibility, and the second handle extends through a second opening of the hem for accessibility.

18. The kit of claim 15, wherein the first part of the first rail is a same part as the first part of the second rail, and wherein the second part of the first rail is a mirrored part of the second part of the second rail.

19. The kit of claim 15, wherein the tray comprises captive screws to couple the interchangeable adapter bracket to the front portion of the tray and to couple the computer to the tray.

20. The kit of claim 15, comprising a dampening material adhered to a surface of the interchangeable adapter bracket to reduce cosmetic marring of the electronic device when the interchangeable adapter bracket is installed on the tray and in contact with the electronic device.

* * * * *